United States Patent [19]

Sturm

[11] Patent Number: 5,205,439
[45] Date of Patent: Apr. 27, 1993

[54] DISPENSER FOR SUPPLYING SMALL AMOUNTS OF A PASTY SUBSTANCE FOR SURFACE MOUNTING OF ELECTRONIC PARTS

[76] Inventor: Karsten Sturm, Uferstrasse 19, D-5000 Cologne 50, Fed. Rep. of Germany

[21] Appl. No.: 697,067

[22] Filed: May 8, 1991

[30] Foreign Application Priority Data

May 8, 1990 [DE] Fed. Rep. of Germany ....... 4014760

[51] Int. Cl.$^5$ ............................................. G01F 11/00
[52] U.S. Cl. ..................... 222/1; 222/146.1; 222/309; 222/504; 222/518; 222/559
[58] Field of Search .................. 222/309, 146.1, 146.2, 222/501, 518, 510, 504, 333, 1; 118/641, 559, 380, 41, 47

[56] References Cited

U.S. PATENT DOCUMENTS

| | | | |
|---|---|---|---|
| 1,356,837 | 10/1920 | Stegmaier | 222/559 X |
| 3,332,581 | 7/1967 | Estabrooks | 222/309 |
| 3,690,518 | 9/1972 | Baker et al. | 222/504 |
| 3,811,601 | 5/1974 | Reighard et al. | 222/504 X |
| 3,834,622 | 9/1974 | Berg et al. | 222/146.2 X |
| 4,168,942 | 9/1979 | Firth | 222/146.2 X |
| 4,210,261 | 7/1980 | Trujillo et al. | 222/47 X |
| 4,252,255 | 2/1981 | Henderson | 222/135 |
| 4,360,132 | 11/1982 | Vilagi et al. | 222/504 |
| 4,465,212 | 8/1984 | Boone | 222/504 |
| 4,471,887 | 9/1984 | Decker | 222/135 |
| 4,579,255 | 4/1986 | Frates et al. | 222/518 X |
| 4,767,031 | 8/1988 | Pröepper | 222/380 X |
| 4,801,051 | 1/1989 | Lewis et al. | 222/309 |
| 4,871,088 | 10/1989 | Cox | 222/47 |
| 4,893,738 | 1/1990 | Gelinas | 222/380 |
| 5,094,276 | 3/1992 | Caputo et al. | 222/559 X |

FOREIGN PATENT DOCUMENTS

| | | |
|---|---|---|
| 1498366 | 11/1968 | Fed. Rep. of Germany ... 222/146.2 |
| 3728054 | 3/1989 | Fed. Rep. of Germany . |
| 3935709 | 5/1991 | Fed. Rep. of Germany . |

Primary Examiner—Kevin P. Shaver
Assistant Examiner—A. Pomrening
Attorney, Agent, or Firm—Eckert Seamans Cherin & Mellott

[57] ABSTRACT

The dispenser is used for supplying small amounts of a pasty substance, e.g. solder paste, onto printed circuit boards for the surface mounting of electronic components. It has a generally tube-like housing (20) forming at its lower end a nozzle (54) and a valve face (32). A nozzle element (28) is slidably arranged in the housing (20), has a valve needle (30) cooperating with the valve face (32), and furtheron is biased in closed position of the valve needle (30) at the valve face (32) by a spring (44) and connected with a plunger (40) arranged in a cylindrical part of the housing (20). The housing (20) is surrounded by a tube-like shell (56) in such a distance, that a toroidal chamber (58) between housing (20) and shell (56) is formed. During use cooling or heating gas flows through this toroidal chamber (58), the toroidal chamber (58) furtheron having an upper connector (62) for a duct (64) supplying the gas and a lower outlet (70) for free outflow of the gas.

8 Claims, 1 Drawing Sheet

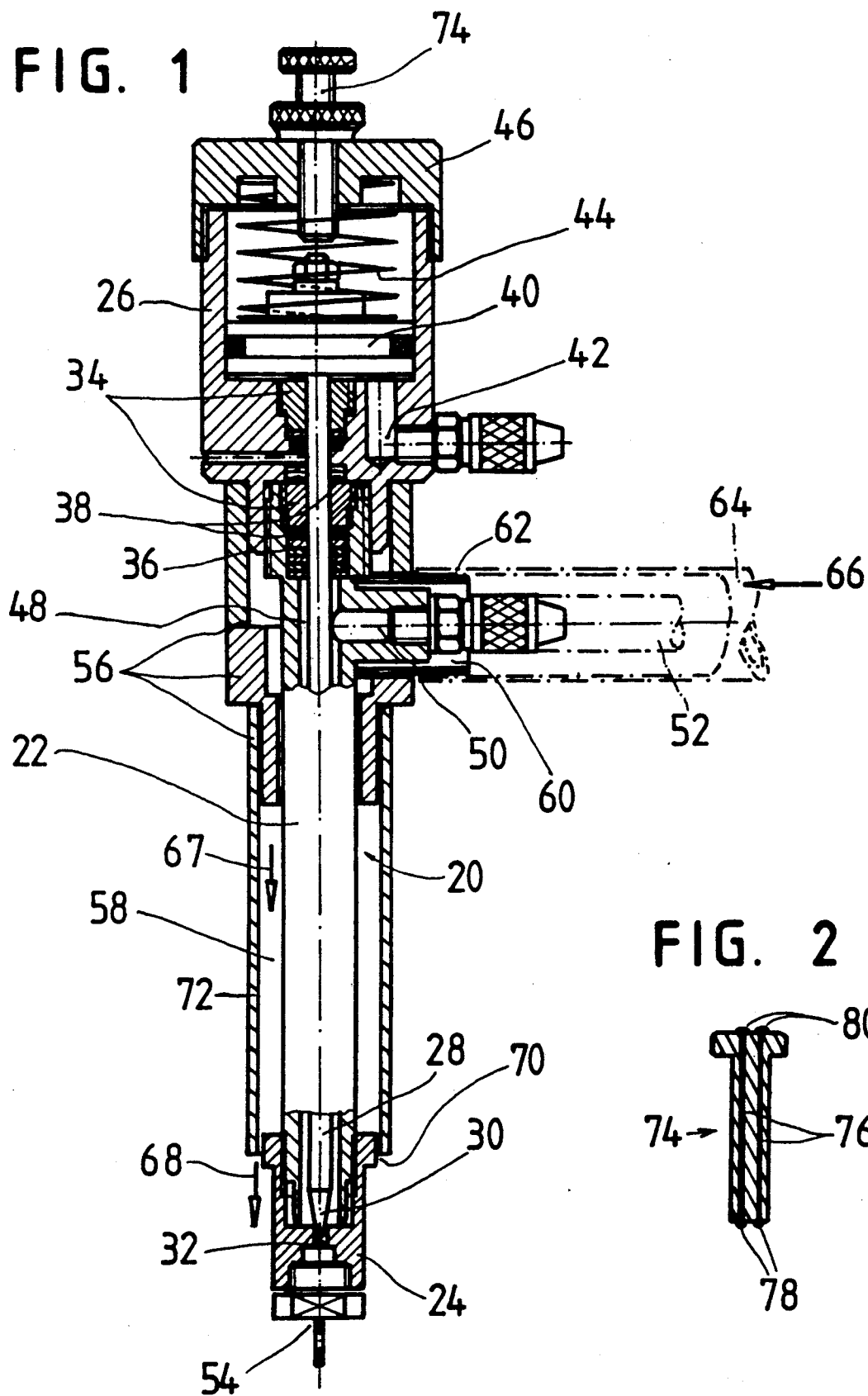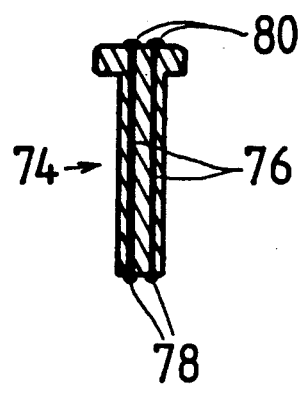

DISPENSER FOR SUPPLYING SMALL AMOUNTS OF A PASTY SUBSTANCE FOR SURFACE MOUNTING OF ELECTRONIC PARTS

BACKGROUND OF THE INVENTION

1. Field of the Invention

The invention relates to a dispenser for supplying small amounts of a pasty substance, e.g. adhesive or solder paste, onto printed circuit boards and for surface mounting of electronic components.

2. Prior Art

German printed application 37 28 054 teaches an apparatus and a method for metering and dispensing small amounts of a pasty substance of the kind mentioned above. Thereby a cartridge filled with the adhesive or the solder paste is used. In the cartridge a plunger is arranged, onto which compressed air can be submitted. The cartridge exhibits a hollow needle through which the pasty substance flows when being applied onto a printed circuit board. The cartridge is surrounded on its outside with a heater in the form of a heating coil to keep the cartridge at a desired, constant temperature.

In the known device the complete cartridge has to be exchanged if the supply of pasty substance is consumed. Contrary to this, in an apparatus according to the invention, the pasty substance is supplied to a dispenser from a supply vessel which may be a cartridge. Only a very small amount of the pasty substance is in the dispenser. The dispenser is used only to dispense portions of the pasty substance; storage of the pasty substance takes place outside of the dispenser. Compared with a filled cartridge according to the state of the art, a dispenser according to the invention is lighter and smaller, its mass does not change with filling height, and it can be continuously supplied with pasty substance thereby avoiding work interruptions in order to replace an empty cartridge.

A dispenser of the kind mentioned above is described in the published German application 39 35 709 of the applicant. The dispenser described there has no means for controlling the temperature. Furthermore, the amount of pasty substance ejected is substantially determined by the pressure acting on the pasty substance, by the flow characteristics of the pasty substance and the time duration that the valve needle is lifted from the valve face.

SUMMARY OF THE INVENTION

It is an object of the invention to provide a dispensing unit which may be continuously supplied with pasty substance without a possibility that the substance will harden.

This object is accomplished according to the invention by a dispenser for supplying small amounts of a pasty substance, e.g. adhesive or solder paste, onto printed circuit boards for surface mounting of electronic components, comprising a substantially tube-like body with a nozzle and valve face in its lower portion, and with an inlet for entry of the pasty substance into an inner compartment. A nozzle element is slidably arranged in the housing and exhibits a valve needle cooperating with the valve face. A spring biasing the nozzle element into off-position is provided. A plunger is attached to the nozzle element and arranged in a cylindrical space of the housing. A tube-like shell freely surrounds the housing thus creating a toroidal chamber between housing and shell. During use a cooling or heating gas flows through this toroidal chamber, which has an upper connection for a duct supplying the gas and a lower outlet from which the gas escapes into the surrounding atmosphere.

The small amount of pasty substance contained in the dispenser is constantly kept at a desired temperature by the gas flowing axially through the toroidal chamber, thereby eliminating any risk that the pasty substance within the dispenser will harden and block the pathway to the nozzle. If the dispenser is, for example, used for dispensing adhesive, longer periods between uses may be tolerated, for example during weekends, without running the risk that the adhesive will harden within the dispenser. The dispenser according to the invention permits delivery of a precise amount of pasty substance over a constant time interval, independent of the filling height of a supply container, of the temperature or other parameters of the environment.

It has proven to be rather advantageous to form the connector for supplying the gas as a tube and to arrange it in such a way that it surrounds the inlet for the pasty substance. In this way the duct for the pasty substance is completely covered by a jacket in which a cooling or heating gas flows. Furthermore, the dispenser may be supplied with cooling or heating gas from a fixed station, which may take the form of an intermediate station in accordance with the German application 39 35 709, or may take the form of some other supply container.

Furthermore, it is advantageous to direct the gas outlet downwards in the direction of the nozzle outlet and form it annularly. The ejecting gas flowing downwards heats or cools the lower portion of the dispenser, thereby avoiding a hardening of the pasty substance within the dispenser.

It is very advantageous to form the valve needle like a truncated cone and select a size of the valve needle such that it displaces, between its two extreme positions, a volume equal to the amount of pasty substance to be dispensed. Thereby the valve needle and the valve face effect a metering of the amount of pasty substance to be dispensed in each run. Contrary to the operating sequence of the apparatus according to published German application 37 28 054, the pasty substance is not pressed out of the nozzle by compressed air and applied to the printed circuit board. Instead, the valve needle acting as a plunger pushes the amount of pasty substance ahead of it towards the nozzle, whereby a volume of pasty substance which is approximately equal to the displacement is ejected. Thereby the dispensed amount of pasty substance does not depend on the pressure acting on the pasty substance or on its viscosity. According to the invention the pressure acting on the pasty substance within the dispenser is selected such that the pasty substance does not flow out of the nozzle when the valve needle is lifted. The substance only flows out of the nozzle when the valve needle is moved downwards in the direction of the valve face.

Furthermore, it is advantageous that the housing define a tube-like body having a nozzle part releasably attached thereto, the nozzle part including the nozzle and the valve face. By selecting different nozzle parts, the amount of pasty substance ejected during each cycle of the valve needle can be modified. It is advantageous to manufacture the nozzle part of a metal having good thermal conductivity. In this case the gas outlet should be as close as possible to the nozzle part. The nozzle part is kept at a desired temperature by the outflowing gas, and the relatively small amount of pasty substance within the nozzle part is kept at the same desired temperature.

Finally, it is advantageous to provide an electrical contact in the dispenser, especially in the actuating unit of the valve needle, which contact is closed in one final position of the valve needle. This allows monitoring of the operation of the dispenser. In a preferred embodiment the stroke of the valve needle can be mechanically adjusted. In this way, too, the amount of pasty substance ejected can be precisely adjusted.

BRIEF DESCRIPTION OF THE DRAWINGS

Further advantage and characteristics of the invention will become evident from the following description of a non-exclusive embodiment which is explained with the help of the drawings. The figures of the drawings show:

FIG. 1 is a side cross-sectional view of a dispenser according to the invention, and FIG. 2 is a cross-section through an adjusting screw having electrical contacts.

DETAILED DESCRIPTION OF THE PREFERRED EMBODIMENTS

A dispenser has a generally tube-like housing 20, being assembled from several parts, including a tube-like central piece 22, a nozzle part 24 which is screwed to a lower portion of said central piece 22, and a pot-shaped part 26, which is screwed to the other end of the central piece 22. A rodlike nozzle element 28 is axially arranged in the housing 20. A lower, free end of the nozzle element 28 includes a valve needle 30 cooperating with a valve face 32 of the nozzle part 24. In the region where the central piece 22 and the potshaped part 26 meet, plugs 34 and sealing washers 36 are arranged. They surround the nozzle element 28, are cylindrical in this portion and define sealing elements. Springs 38 cooperate with the plug 34 and the sealing washers 36 to elastically bias the sealing elements and provide an automatic adjustment in case of wear. A radial relief bore is provided.

At its upper end the rodlike nozzle element 28 is linked with a flat plunger 40 arranged in an inner compartment of the potshaped part 26 which defines a cylindrical portion around the plunger 40. The plunger 40 sealingly engages the inner wall of said cylindrical portion. In the illustrated embodiment the plunger 40 is in its lowest position, consequently the valve needle 30 bears against the valve face 32. An inlet channel 42 for compressed air is arranged below the plunger 40 and ends radially in a connector for compressed air. If compressed air is supplied there, plunger 40 moves upwards. This is effected against the force of a spring 44 continuously biasing the plunger 40 downward. This spring 44 is arranged between an upper face of the plunger 40 and a cover 46 and takes the form of a helical spring. The cover 46 closes the upwardly directed opening of the potshaped part 26 and is a part of the housing 20.

A toroidal chamber 58 is defined between the nozzle element 28 and the central piece 22 and has a radial dimension of approximately three millimeters. A radial, studlike channel 50 links this toroidal chamber 58 with an outlet screw connector, to which a duct 52 is attached. A pasty substance such as described in published German application 39 35 709 is pressurized within this duct 52. When in use the complete space 48 is filled with the pasty substance.

If the nozzle element 28 is moved upwardly by actuating the plunger 40 with compressed air from the normally closed position shown, the valve needle 30 is lifted from the valve face 32, thereby increasing the volume of the space 48. A corresponding amount of the pasty substance is supplied through duct 52. The pressure acting on the pasty substance is not sufficient to allow for a flow of the pasty substance through the opening defined by the valve face 32. The pasty substance is not pushed downwards unless the valve needle is moved downwardly to force a portion of the pasty substance in front of the valve needle downwards.

It should be stressed here that the operating sequence of the dispenser according to the invention described above is preferred, but that other operating sequences are possible as well. In this respect the pressure acting on the pasty substance may be sufficient to allow for an outflow of the pasty substance at the bottom of the nozzle part 24, whereby valve needle 30 and valve face 32 merely act as a kind of drop shutter which starts and stops the passage of the pasty substance.

A nozzle 54 is screwed in to the bottom of the nozzle part 24 and carries a hollow needle at its free end.

Central piece 22 is freely surrounded by a shell 56, thereby defining the toroidal chamber 58, which is concentric to the space 48. The shell 56 in the embodiment shown is made up of tube-like plastic parts. Free space between the shell 56 and the outer wall of the central piece 22 is designed to be small, approximately two millimeters. In a preferred embodiment, which is not shown in the drawing, shell 56 has narrow, inwardly protruding rips or naps bearing against the outer wall of the central piece 22 which provide a uniform clearance between the central piece 22 and the shell 56. The toroidal chamber 58 communicates with a radial channel 60, which carries a connector 62. This radial channel 60 is coaxial to the channel 50 and surrounds it. A duct 64 (shown in dash-dot) is fixed at connection 62. A gas flows in the direction of arrow 66 through this channel 60 into the toroidal chamber 58. This gas further flows in the direction of arrow 67 through the toroidal chamber and flows out in the direction of arrow 68 at a ring-like outlet 70 into the surrounding atmosphere. Thereby the gas touches the outer wall of the nozzle part 24 and cools it. The nozzle part 24 is made of a material having a good thermal conductivity, e.g. metal.

In the embodiment shown a portion of the shell 56 is designed to be supported in a bore of a support, whereby the dispenser is inserted and mechanically supported in the bore. Motors for moving the support (not shown) in a direction oblique to the axial direction and in the axial direction are provided. In this way the dispenser may be moved to a desired position above a printed circuit board (not shown) and may be lowered onto it.

The stroke of the nozzle element 28 is limited (not shown in FIG. 1) downward by the valve needle 30 touching the valve face 32. Upward movement is limited by an adjusting device which will be described now. An adjusting screw 74 is centrically provided in the cover 46 and screwed into a screw thread of the cover 46. This adjusting screw 74 cooperates with a security nut. The adjusting screw is made of an electrically insulating material, e.g. a plastic. As shown in FIG. 2, the adjusting screw 74 has two bores which accommodate electrical conductors 76. Each conductor 76 is connected with a lower contact 78 at a lower end of the adjusting screw 74, and with an upper contact 80 on the head of the adjusting screw.

The nozzle element 28 is made of a metal and is electrically conductive. The upward stroke of the nozzle element 28 is limited by the adjusting screw 74 due to an upper end of the nozzle element 28 touching the two lower contacts 78. Thereby, the metallic nozzle element electrically bridges the lower contacts 78, that is, provides electrical continuity between them.

If electrical continuity between the two upper contacts 80 is tested, two conditions can be monitored. When electrical continuity exists between the upper contacts 80, the nozzle element is touching the two lower contacts 78. When electrical continuity does not exist between the upper contacts 80, there is a gap between the nozzle element 28 and the two lower contacts 78 (condition as shown in FIG. 1).

I claim:

1. A method for dispensing small amounts of a pasty substance in the form of one of adhesive and solder paste onto printed circuit boards for surface mounting of electronic components, comprising;
   proving a generally tubular housing having a nozzle and a valve face at a lower end, and defining an inner component having an inlet for the pasty substance;
   slidably arranging a nozzle element in said housing, said nozzle element having a stroke defined by movement between points in said housing, said nozzle element including a valve needle cooperating with said valve face, said nozzle element being biased by a spring to close said valve needle against said valve face, said nozzle element being connected to a plunger arranged in a cylindrical portion of the housing;
   surrounding the housing with a tubular shell thereby defining a toroidal chamber between said housing and said shell, said toroidal chamber carrying temperature modifying fluid, said fluid being provided at an upper connector connected to a supply duct and exiting at a lower outlet so that the fluid is directed toward and touches the nozzle to modify the temperature of the nozzle and pasty substance;
   choosing the pressure under which the pasty substance is provided, whereby the pasty substance remains in the compartment when a valve comprising said valve needle and said valve face is in an open position.

2. A dispenser for supplying small amounts of a pasty substance, in the form of one of adhesive and solder paste, onto printed circuit boards for surface mounting of electronic components, comprising:
   a generally tubular housing having a nozzle part and a valve face at its lower end and defining an inner compartment having an inlet for the pasty substance;
   a nozzle element slidably arranged in the housing and having a stroke defined by movement between points in said housing, said nozzle element including a valve needle cooperating with the valve face, said nozzle element being biased by a spring to close the valve needle against the valve face the nozzle element being connected to a plunger arranged in a cylindrical portion of the housing; and,
   a tubular shell freely surrounding the housing and defining a toroidal chamber between the housing and the shell such that during use, cooling or heating gas enters the toroidal chamber at an upper connector, the gas being supplied from a duct which surrounds the inlet for the pasty substance, the gas flows through the toroidal chamber, and freely flows out at a ring-shaped lower outlet and is directed toward the nozzle port so that the outflowing gas touches the outerwall of the nozzle port for temperature modification of the nozzle port and pasty substance.

3. Dispenser according to claim 2, wherein the valve needle is a truncated cone and displaces during its stroke a volume, which essentially equals the volume of the pasty substance to be dispensed.

4. Dispenser according to claim 2 wherein the housing has a releasably attached central piece, and the nozzle part forms the valve face.

5. Dispenser according to claim 2, wherein the nozzle part is made of a material having a good thermal conductivity.

6. Dispenser according to claim 2, wherein an adjusting screw is provided for limiting the stroke of the nozzle element.

7. Dispenser according to claim 6 wherein the adjusting screw has two electrical contacts on its face facing the nozzle element, each contact being in electrical connection with a contact on an opposite face of the adjusting screw for an electrical sensing of the nozzle element, said nozzle element being electrically conducting, thereby bridging the two contacts on the face facing the nozzle element when the adjusting screw travels downward to the two contacts.

8. Dispenser according to claim 6, wherein the adjusting screw is made of an electrically insulating material and has two separate lower contacts at its lower end facing the nozzle element, which lower contacts are linked via conductors to upper contacts on a head of the adjusting screw, and the nozzle element is made of an electrically conducting material, so that whenever the nozzle element touches the two lower contacts a current can flow from one upper contact to the other upper contact, whereas no current can flow from one upper contact to the other upper contact when the nozzle element does not touch the two lower contacts on the lower end of the adjusting screw.

* * * * *

UNITED STATES PATENT AND TRADEMARK OFFICE
CERTIFICATE OF CORRECTION

PATENT NO. : 5,205,439
DATED : April 27, 1993
INVENTOR(S) : Karsten Sturm

It is certified that error appears in the above-identified patent and that said Letters Patent is hereby corrected as shown below:

Column 6, line 19, change "port" to --part--.

Column 6, line 21, change "port" to --part--.

Column 6, line 22, change "port" to --part--.

Signed and Sealed this

Eleventh Day of January, 1994

Attest:

BRUCE LEHMAN

*Attesting Officer*     *Commissioner of Patents and Trademarks*